United States Patent
Woo et al.

(10) Patent No.: US 7,403,072 B2
(45) Date of Patent: Jul. 22, 2008

(54) INTEGRATED CIRCUIT DEVICES HAVING A CONTROL CIRCUIT FOR BIASING AN AMPLIFIER OUTPUT STAGE AND METHODS OF OPERATING THE SAME

(75) Inventors: Jae Hyuck Woo, Gyeonggi-do (KR); Kyu Young Chung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 117 days.

(21) Appl. No.: 11/271,058

(22) Filed: Nov. 10, 2005

(65) Prior Publication Data
US 2006/0132233 A1  Jun. 22, 2006

(30) Foreign Application Priority Data
Dec. 17, 2004  (KR) .................... 10-2004-0107996

(51) Int. Cl.
*H03F 3/26* (2006.01)

(52) U.S. Cl. ..................................... 330/267; 330/251
(58) Field of Classification Search ......... 330/252–260, 330/267
See application file for complete search history.

(56) References Cited

U.S. PATENT DOCUMENTS

| 7,187,235 B2* | 3/2007 | Moon .......................... 330/255 |
| 2006/0091955 A1* | 5/2006 | Choi ........................... 330/260 |

* cited by examiner

*Primary Examiner*—Robert Pascal
*Assistant Examiner*—Hieu P Nguyen
(74) *Attorney, Agent, or Firm*—Myers Bigel Sibley & Sajovec, P.A.

(57) ABSTRACT

An integrated circuit device includes an amplifier circuit that generates an output voltage. A bias control circuit is configured to generate a bias control voltage or the output voltage at an output thereof based on a state of a control signal. An output stage driver circuit that is responsive to the voltage generated at the output of the bias control circuit.

9 Claims, 4 Drawing Sheets

Prior Art

INTEGRATED CIRCUIT DEVICES HAVING A CONTROL CIRCUIT FOR BIASING AN AMPLIFIER OUTPUT STAGE AND METHODS OF OPERATING THE SAME

RELATED APPLICATION

This application claims the benefit of and priority to Korean Patent Application No. 2004-0107996, filed Dec. 17, 2004, and allowed Jun. 11, 2007, the disclosure of which is hereby incorporated herein by reference.

FIELD OF THE INVENTION

The present invention relates generally to integrated circuit devices and methods of operating the same and, more particularly, to integrated circuit devices having a bias control circuit methods of operating the same.

BACKGROUND OF THE INVENTION

In general, an operational amplifier (OP-AMP) that has two or more stages uses a compensation capacitor to provide stability. For example, FIG. 1 illustrates a conventional source driver circuit 100 including an amplifier 110, a switch 120, and a load 130, which are configured as shown. The amplifier 110 amplifies an input and generates an output for the load 130 through the switch 120. The amplifier 110 may be designed to have a constant slew rate and stability within a particular frequency characteristic and phase characteristic. Thus, the amplifier 110 may be designed to drive the load 130. As the load 130 increases, the frequency and phase characteristics may worsen. Unfortunately, this may result in an increase in DC current consumption.

SUMMARY OF THE INVENTION

According to some embodiments of the present invention, an integrated circuit device includes an amplifier circuit that generates an output voltage. A bias control circuit is configured to generate a bias control voltage or the output voltage at an output thereof based on a state of a control signal. An output stage driver circuit that is responsive to the voltage generated at the output of the bias control circuit.

In other embodiments, the output stage driver circuit comprises a totem-pole output stage driver.

In still other embodiments, an output current generated through the output stage driver circuit responsive to the bias control voltage is less than an output current generated through the output stage driver circuit responsive to the output voltage.

In still other embodiments, the integrated circuit device further includes a switch that is operable responsive to the control signal and a load connected to the output stage driver circuit via the switch. The bias control circuit is configured to generate the bias control voltage at the output thereof when the switch is in an open state responsive to the control signal and is configured to generate the output voltage at the output thereof when the switch is in a closed state responsive to the control signal.

In further embodiments, an integrated circuit device includes an amplifier circuit that generates first and second output voltages. A first bias control circuit is configured to generate a first bias control voltage or the first output voltage at an output thereof based on a state of a control signal. A second bias control circuit is configured to generate a second bias control voltage or the second output voltage at an output thereof based on the state of the control signal. An output stage driver circuit is responsive to the voltages generated at the outputs of the first and second bias control circuits.

In still further embodiments, an output current generated through the output stage driver circuit responsive to the first and second bias control voltages is less than an output current generated through the output stage driver circuit responsive to the first and second output voltages.

In still further embodiments, the output stage driver circuit comprises a totem-pole output stage driver.

In still further embodiments, the totem-poll output stage driver comprises a PMOS transistor that is responsive to the voltage at the output of the first bias control circuit and an NMOS transistor that is responsive to the voltage at the output of the second bias control circuit.

In still further embodiments, the first bias control voltage is greater than the first output voltage and the second bias control voltage is less than the second output voltage.

In still further embodiments, the integrated circuit device further comprises a switch that is operable responsive to the control signal and a load connected to the output stage driver circuit via the switch. The first and second bias control circuits are configured to generate the first and second bias control voltages at the outputs thereof, respectively, when the switch is in an open state responsive to the control signal and are configured to generate the first and second output voltages at the outputs thereof, respectively, when the switch is in a closed state responsive to the control signal.

Although described above primarily with respect to device embodiments of an integrated circuit device flash memory, it will be understood that the present invention is not limited to such embodiments, but may also be embodied as methods of operating an integrated circuit device.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
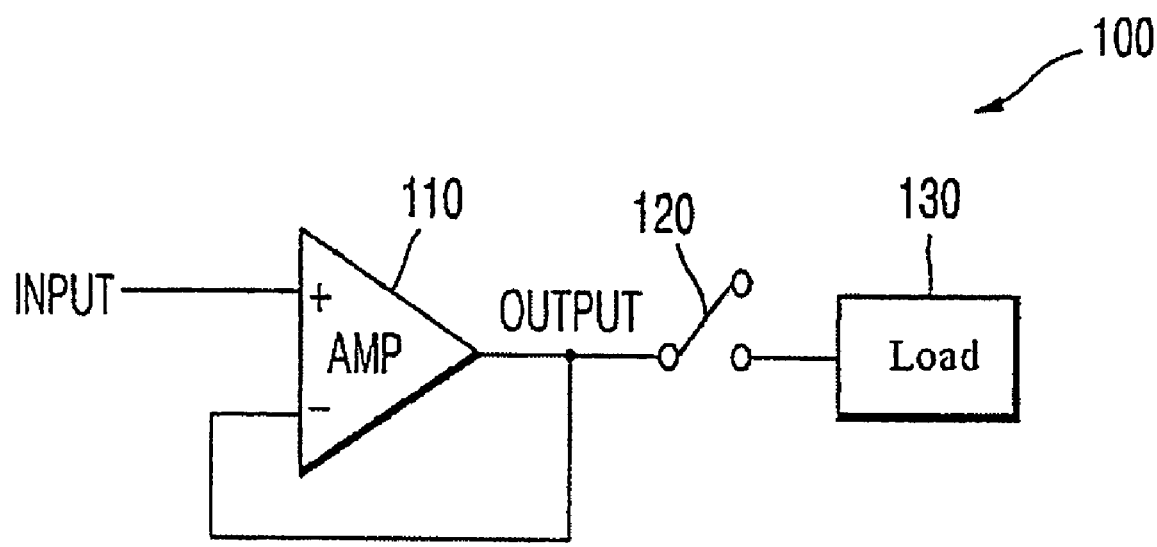
FIG. 1 is a block diagram that illustrates a conventional source driver circuit.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
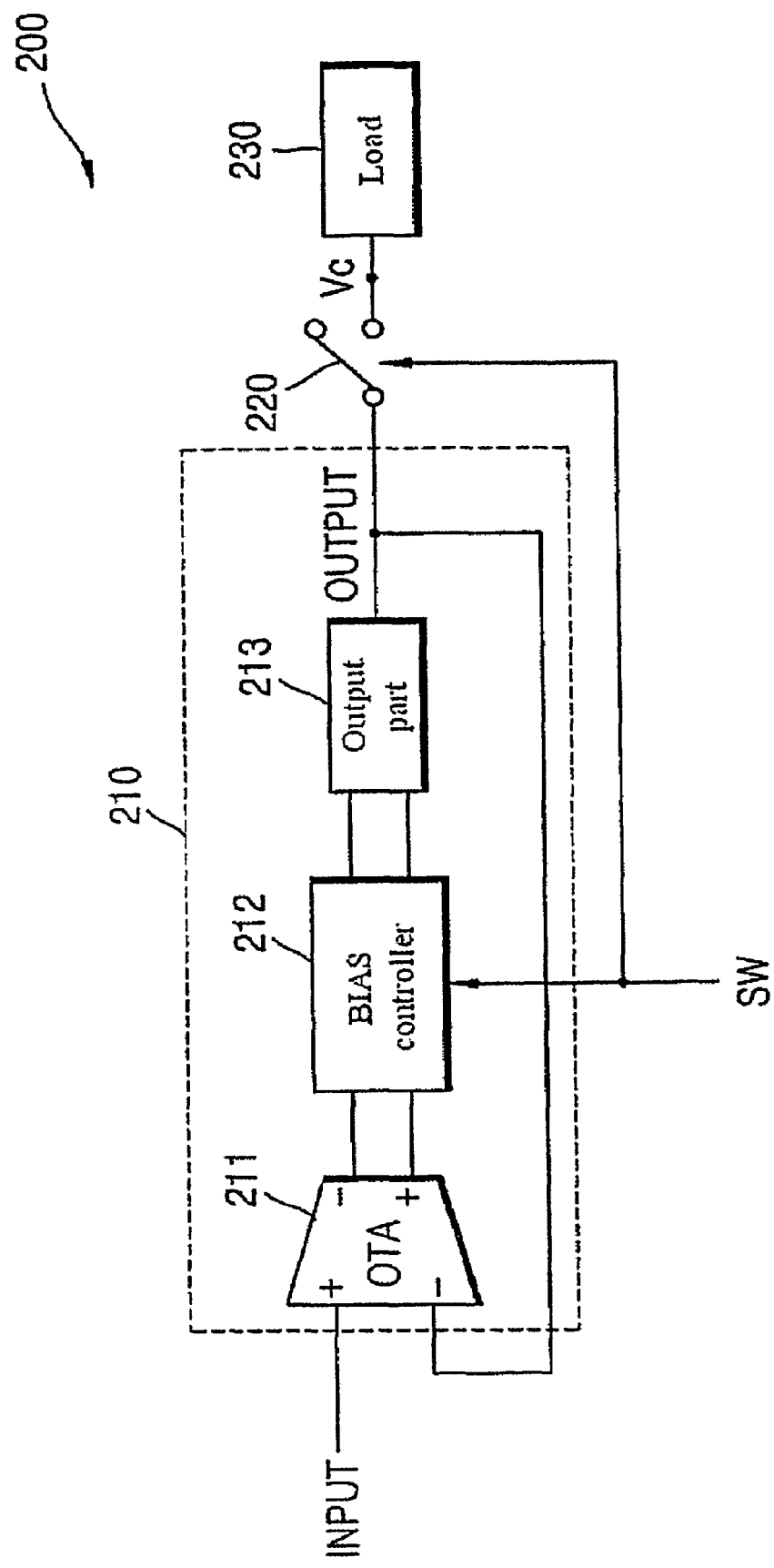
FIG. 2 is a block diagram of a load driving system in accordance with some embodiments of the present invention.

FIG. 2 is a block diagram of a load driving system 200 in accordance with some embodiments of the present invention. The load driving system comprises an amplifier 210, a switch 220, and a load 230. The switch 220 can be opened or closed based on the logical state of a control signal SW. If the switch 220 is closed, then the output of the amplifier 210 is applied to the load 230. If the switch is open, then the output of the amplifier is not applied to the load 230.

The amplifier 210 comprises an Operational Transconductance Amplifier (OTA) 211, a bias control unit 212, and an output unit 213 in accordance with some embodiments of the present invention. The OTA 211 generates at least one amplified signal/voltage at one or more outputs thereof. The bias control unit 212 is configured to generate a bias control voltage or the at least one amplified signal at an output thereof in response to the switch control signal SW. The output unit 213 is configured to generate an output signal OUTPUT in response to the signals/voltages output from the bias control unit 212. The output unit 213 may comprise a totem-pole output stage driver circuit in accordance with some embodiments of the present invention.

Advantageously, the output unit 213 may be biased differently based on whether the load 230 is coupled to the output of the amplifier 210. By biasing the output unit 213 appropriately when the load 230 is disconnected from the amplifier 210, current usage by the amplifier can be reduced.

Figure 3:
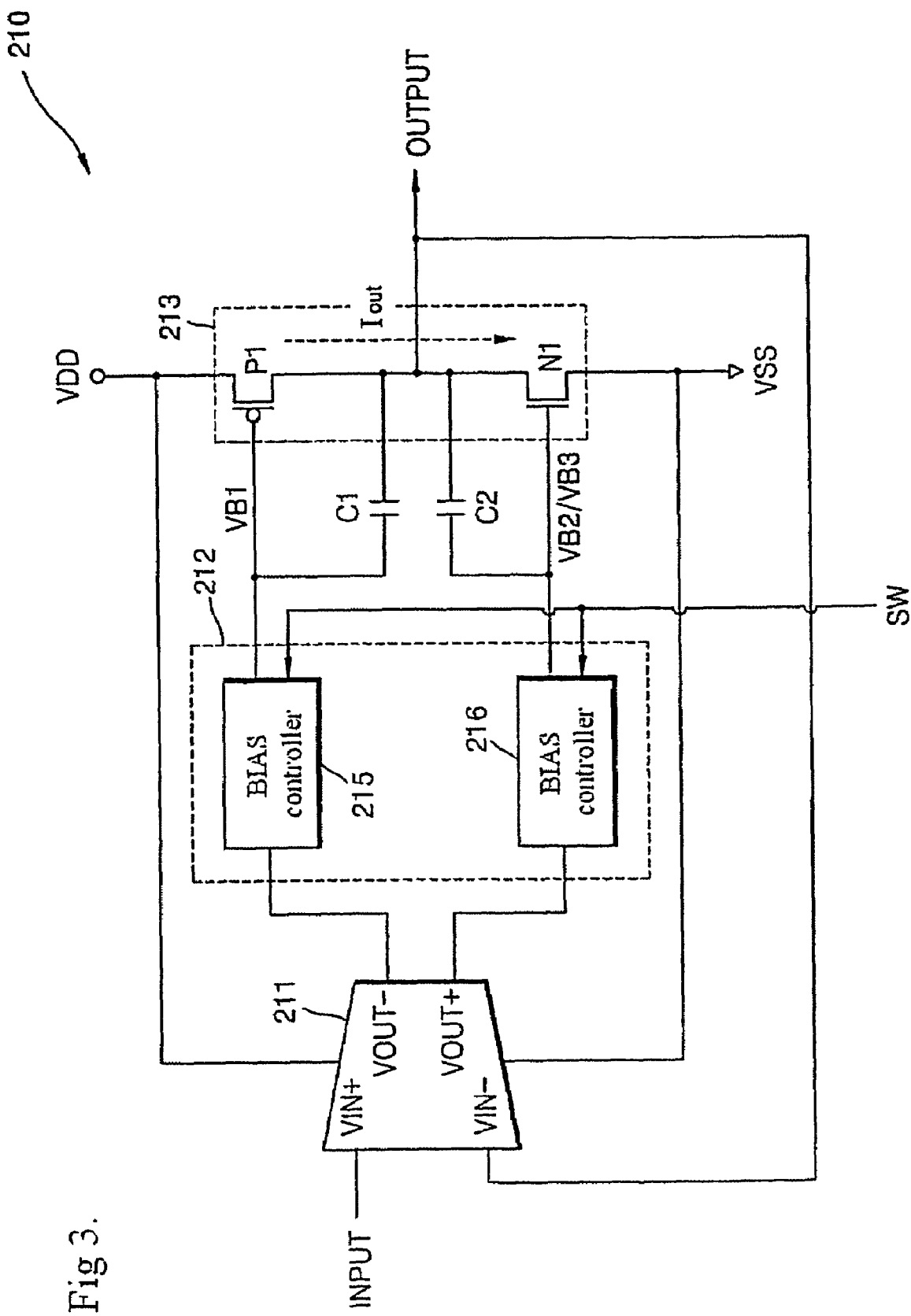
FIG. 3 is a circuit schematic of a load driving system in accordance with further embodiments of the present invention.

FIG. 3 is a circuit schematic of a load driving system in accordance with further embodiments of the present invention. As shown in FIG. 3, the bias controller 212 comprises a first bias controller unit 215 and a second bias controller unit 216. The output unit 213 comprises transistors P1 and N1, which are arranged in a totem pole configuration.

The OTA 211 receives an input signal INPUT through a VIN+ node and receives the output signal OUTPUT as a feedback signal from the output unit 213 through a VIN− node. The OTA 211 may output a first differential signal/voltage VOUT− and a second differential signal/voltage VOUT+. The first bias controller unit 215 generates a first bias signal/voltage VB1 and selectively outputs the first differential signal VOUT− or the first bias signal/voltage VB1 based on a logical state of the switch control signal SW. The second bias controller unit 216 generates a second bias signal/voltage VB2 and selectively outputs the second differential signal VOUT+ or the second bias signal/voltage VB2 based on the logical state of the switch control signal SW. In some embodiments of the present invention, if the switch control signal SW is in a state such that the load 230 is connected to the amplifier 210, then VOUT− and VOUT+ are output to the output unit 213. If the switch control signal SW is in a state such that the load 230 is disconnected from the amplifier 210, then VB1 and VB2 are output to the output unit 213. In some embodiments of the present invention, VB1>VOUT− and VB2<VOUT+.

As shown in FIG. 3, the output unit 213 comprises transistors P1 and N1. The gate of P1 receives the output signal/voltage from the first bias controller unit 215 and the gate of N1 receives the output signal/voltage from the second bias controller unit 216.

Figure 4:
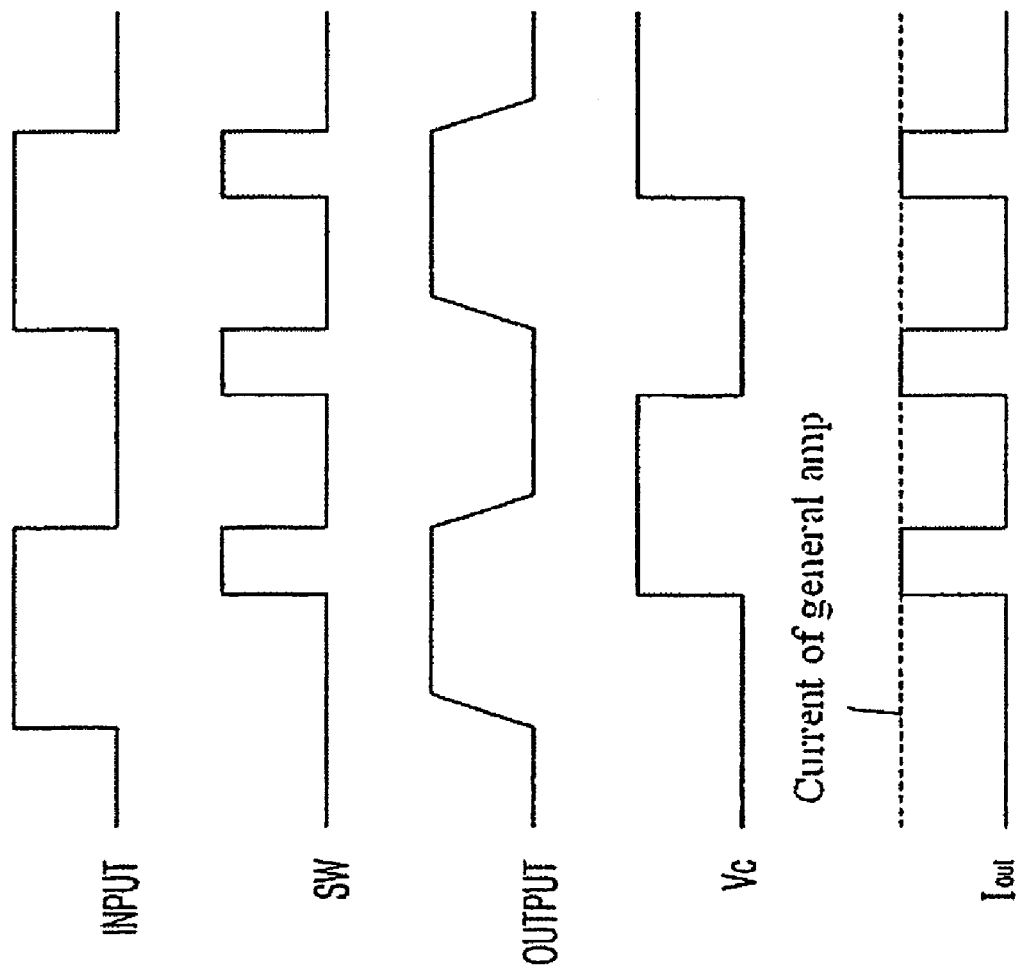
FIG. 4 is a waveform diagram that illustrates operations of the load driving system of FIGS. 2 and 3 in accordance with some embodiments of the present invention.

FIG. 4 is a waveform diagram that illustrates operations of the load driving system of FIGS. 2 and 3 in accordance with some embodiments of the present invention. Before the SW signal is driven high to connect the load 230 to the amplifier 210 via the switch 220, the input signal INPUT is amplified by the OTA 211. In this case, however, the bias signals/voltages VB1 and VB2 are applied to the output unit 213. As a result, the output current Iout in the output unit 213 is relatively small. The output signal/voltage OUTPUT is not transferred to the load 230 at this time. When the SW signal is driven high to connect the load 230 to the amplifier 210 via the switch 220, the differential signals VOUT+ and VOUT− are applied to the output unit 213. At this time, the output signal/voltage OUTPUT is transferred to the load 230. As a result, the output current Iout in the output unit 213 is relatively large. The current Iout through the output unit 213 differs based on the logical state of the switch signal SW in accordance with some embodiments of the present invention.

In some embodiments of the present invention, the OTA 211 may not generate VOUT+. In this case, the second bias controller 216 may apply a constant bias to the output unit 213 transistor N1. Operations of the load driving system remain the same as discussed above with respect to FIG. 3 with the exception that a constant signal/voltage VB3 is generated by the second bias controller 216 and applied to the output unit 213 transistor N1. The signals/voltages are related as follows: VB1>VOUT− and VB2<VB3.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. An integrated circuit device, comprising:
   an amplifier circuit that generates an output voltage;
   a bias control circuit that is configured to generate a bias control voltage or the output voltage at an output thereof based on a state of a control signal;
   an output stage driver circuit that is responsive to the voltage generated at the output of the bias control circuit;
   a switch that is operable responsive to the control signal; and
   a load connected to the output stage driver circuit via the switch;
   wherein an output current generated through the output stage driver circuit responsive to the bias control voltage is less than an output current generated through the output stage driver circuit responsive to the output voltage; and
   wherein the bias control circuit is configured to generate the bias control voltage at the output thereof when the switch is in an open state responsive to the control signal and is configured to generate the output voltage at the output thereof when the switch is in a closed state responsive to the control signal.

2. The integrated circuit device of claim 1, wherein the output stage driver circuit comprises a totem-pole output stage driver.

3. An integrated circuit device, comprising:
an amplifier circuit that generates first and second output voltages;
a first bias control circuit that is configured to generate a first bias control voltage or the first output voltage at an output thereof based on a state of a control signal;
a second bias control circuit that is configured to generate a second bias control voltage or the second output voltage at an output thereof based on the state of the control signal;
an output stage driver circuit that is responsive to the voltages generated at the outputs of the first and second bias control circuits;
a switch that is operable responsive to the control signal; and
a load connected to the output stage driver circuit via the switch;
wherein an output current generated through the output stage driver circuit responsive to the first and second bias control voltages is less than an output current generated through the output stage driver circuit responsive to the first and second output voltages; and
wherein the first and second bias control circuits are configured to generate the first and second bias control voltages at the outputs thereof, respectively, when the switch is in an open state responsive to the control signal and are configured to generate the first and second output voltages at the outputs thereof, respectively, when the switch is in a closed state responsive to the control signal.

4. The integrated circuit device of claim 3, wherein the output stage driver circuit comprises a totem-pole output stage driver.

5. The integrated circuit device of claim 4, wherein the totem-poll output stage driver comprises a PMOS transistor that is responsive to the voltage at the output of the first bias control circuit and an NMOS transistor that is responsive to the voltage at the output of the second bias control circuit.

6. The integrated circuit device of claim 5, wherein the first bias control voltage is greater than the first output voltage and the second bias control voltage is less than the second output voltage.

7. A method of operating integrated circuit device, comprising:
generating an output voltage;
generating a bias control voltage at an output of a bias control circuit when a switch is in an open state responsive to a control signal;
generating the output voltage at the output of the bias control circuit when the switch is in a closed state responsive to the control signal; and
driving an output stage driver circuit using the voltage generated at the output of the bias control circuit;
wherein an output current generated through the output stage driver circuit responsive to the bias control voltage is less than an output current generated through the output stage driver circuit responsive to the output voltage.

8. A method of operating an integrated circuit device, comprising:
generating first and second output voltages;
generating first and second bias control voltages at outputs of first and second bias control circuits, respectively, when a switch is in an open state responsive to a control signal;
generating the first and second output voltages at the outputs of the first and second bias control circuits, respectively, when the switch is in a closed state responsive to the control signal; and
driving an output stage driver circuit using the voltages generated at the outputs of the first and second bias control circuits;
wherein an output current generated through the output stage driver circuit responsive to the first and second bias control voltages is less than an output current generated through the output stage driver circuit responsive to the first and second output voltages.

9. The method of claim 8, wherein the first bias control voltage is greater than the first output voltage and the second bias control voltage is less than the second output voltage.

* * * * *